(12) United States Patent
Shinada et al.

(10) Patent No.: US 11,542,592 B2
(45) Date of Patent: Jan. 3, 2023

(54) FILM FORMING SYSTEM AND METHOD FOR FORMING FILM ON SUBSTRATE

(71) Applicant: TOKYO ELECTRON LIMITED, Tokyo (JP)

(72) Inventors: Masato Shinada, Tokyo (JP); Naoki Watanabe, Yamanashi (JP); Tetsuya Miyashita, Yamanashi (JP); Hiroaki Chihaya, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 268 days.

(21) Appl. No.: 16/246,285

(22) Filed: Jan. 11, 2019

(65) Prior Publication Data

US 2019/0252165 A1    Aug. 15, 2019

(30) Foreign Application Priority Data

Feb. 13, 2018    (JP) .............................. JP2018-022894

(51) Int. Cl.
*C23C 14/22*    (2006.01)
*C23C 14/35*    (2006.01)
*C23C 14/50*    (2006.01)
*H01J 37/34*    (2006.01)

(52) U.S. Cl.
CPC ............ *C23C 14/225* (2013.01); *C23C 14/35* (2013.01); *C23C 14/505* (2013.01);
(Continued)

(58) Field of Classification Search
CPC ............... H01J 37/3447; H01J 37/3408; H01J 37/3455; H01J 37/3441; C23C 14/35;
(Continued)

(56) References Cited

U.S. PATENT DOCUMENTS 5,223,112 A * 6/1993 Tepman ............ H01J 37/32623
                                                  204/298.11
6,521,010 B1 * 2/2003 Katata ................ C23C 14/3464
                                                  204/192.12
(Continued)

FOREIGN PATENT DOCUMENTS

JP          60197869 A  * 10/1985 ............. C23C 14/34
JP      H05-287519 A    11/1993
(Continued)

OTHER PUBLICATIONS

Machine Translation JP 08165569 (Year: 1996).*
Machine Translation JP 05287519 (Year: 1993).*

*Primary Examiner* — Michael A Band
(74) *Attorney, Agent, or Firm* — Fenwick & West LLP

(57) ABSTRACT

A film forming system comprises a chamber, a stage, a holder, a cathode magnet, a shield, a first moving mechanism, and a second moving mechanism. The chamber provides a processing space. The stage is provided in the processing space and configured to support a substrate. The holder is configured to hold a target that is provided in the processing space. The cathode magnet is provided outside the chamber with respect to the target. The shield has a slit and is configured to block particles released from the target around the slit. The first moving mechanism is configured to move the shield between the stage and the target along a scanning direction substantially parallel to a surface of the substrate mounted on the stage. The second moving mechanism is configured to move the cathode magnet along the scanning direction.

3 Claims, 17 Drawing Sheets

(52) U.S. Cl.
CPC ...... *H01J 37/3408* (2013.01); *H01J 37/3441* (2013.01); *H01J 37/3447* (2013.01); *H01J 37/3455* (2013.01); *H01J 2237/332* (2013.01)

(58) Field of Classification Search
CPC ..... C23C 14/505; C23C 14/54; C23C 14/542; C23C 14/225
See application file for complete search history.

(56) References Cited

U.S. PATENT DOCUMENTS

| | | | |
|---|---|---|---|
| 7,033,461 B2 * | 4/2006 | Tani | C23C 14/044 |
| | | | 118/504 |
| 9,206,500 B2 * | 12/2015 | Druz | H01J 37/3488 |
| 9,437,404 B2 * | 9/2016 | Abarra | C23C 14/35 |
| 2014/0097079 A1 * | 4/2014 | Endo | C23C 14/35 |
| | | | 204/192.12 |
| 2015/0187549 A1 | 7/2015 | Kitada et al. | |

FOREIGN PATENT DOCUMENTS

| | | |
|---|---|---|
| JP | H08-165569 A | 6/1996 |
| JP | H09-157839 A | 6/1997 |
| JP | 2006-037209 A | 2/2006 |
| JP | 2008-056975 A | 3/2008 |
| JP | 2012-012633 A | 1/2012 |
| JP | 2014-111834 A | 6/2014 |
| JP | 2015-067856 A | 4/2015 |
| KR | 10-2016-0042138 A | 4/2016 |
| WO | WO 2013/179544 A1 | 5/2013 |

* cited by examiner

FILM FORMING SYSTEM AND METHOD FOR FORMING FILM ON SUBSTRATE

CROSS-REFERENCE TO RELATED APPLICATION

This application claims priority to Japanese Patent Application No. 2018-022894 filed on Feb. 13, 2018, the entire contents of which are incorporated herein by reference.

FIELD OF THE INVENTION

The present disclosure relates to a film forming system and a method for forming a film on a substrate.

BACKGROUND OF THE INVENTION

In manufacturing electric/electronic devices, a film forming process is performed to form a film on a substrate. As for a film forming system used for the film forming process, there are known film forming systems disclosed in PCT Publication No. WO2013/179544, Japanese Patent Application Publication No. 2008-56975, and Japanese Patent Application Publication No. 2015-67856.

Each of the film forming systems described in PCT Publication No. WO2013/179544, Japanese Patent Application Publication No. 2008-56975, and Japanese Patent Application Publication No. 2015-67856 includes a vacuum chamber, a stage, and a target. The stage is provided in the vacuum chamber. A substrate is mounted on the stage. The target is provided obliquely above the stage. In the film forming system described in PCT Publication No. WO2013/179544, particles from the target are deposited on the substrate in a state where the substrate is rotated about the center thereof by the stage. A film is formed by the particles deposited on the substrate.

In each of the film forming systems disclosed in Japanese Patent Application Publication Nos. 2008-56975 and 2015-67856, a shield providing an opening is provided between the stage and the target. Particles from the target pass through the opening of the shield to be deposited on the substrate. A film is formed by the particles deposited on the substrate. During the release of particles from the target, the stage is moved to scan the substrate. In each of the film forming systems disclosed in Japanese Patent Application Publication No. 2008-56975 and Japanese Patent Application Publication No. 2015-67856, an incident angle of the particles with respect to the substrate is determined by the relative positional relation between the target and the opening of the shield. As a result, it is possible to selectively form a film at a desired location on the substrate.

In the film forming systems disclosed in Japanese Patent Application Publication Nos. 2008-56975 and 2015-67856, it is not possible to change the incident angle of particles from the target with respect to the substrate. Therefore, it is required to set the incident angle of particles from the target with respect to the substrate to a desired angle.

SUMMARY OF THE INVENTION

In accordance with an aspect, there is provided a film forming system. The film forming system comprises a chamber, a stage, a holder, a cathode magnet, a shield, a first moving mechanism, and a second moving mechanism. The chamber provides a processing space. The stage is provided in the processing space and configured to support a substrate. The holder is configured to hold a target that is provided in the processing space. The cathode magnet is provided outside the chamber with respect to the target. The shield has a slit and is configured to block particles released from the target around the slit. The first moving mechanism is configured to move the shield between the stage and the target along a scanning direction substantially parallel to a surface of the substrate mounted on the stage. The second moving mechanism is configured to move the cathode magnet along the scanning direction.

In accordance with another aspect, there is provided a method for forming a film on a substrate in a film forming system. The film forming system comprises a chamber, a stage, a holder, a cathode magnet, a shield, a first moving mechanism, and a second moving mechanism. The chamber provides a processing space. The stage is provided in the processing space and configured to support a substrate. The holder is configured to hold a target that is provided in the processing space. The cathode magnet is provided outside the chamber with respect to the target. The shield has a slit and is configured to block particles released from the target around the slit. The first moving mechanism is configured to move the shield between the stage and the target along a scanning direction substantially parallel to a surface of the substrate mounted on the stage. The second moving mechanism is configured to move the cathode magnet along the scanning direction.

The film forming method comprises: (i) adjusting a relative positional relation between the slit and the cathode magnet by the first moving mechanism and the second moving mechanism; and (ii) moving the shield and the cathode magnet along the scanning direction by the first moving mechanism and the second moving mechanism while maintaining the relative positional relation between the slit and the cathode magnet during the release of particles from the target in a state where the substrate is mounted on the stage.

BRIEF DESCRIPTION OF THE DRAWINGS

The objects and features of the present disclosure will become apparent from the following description of embodiments, given in conjunction with the accompanying drawings, in which.

DETAILED DESCRIPTION OF THE EMBODIMENTS

Figure 1:
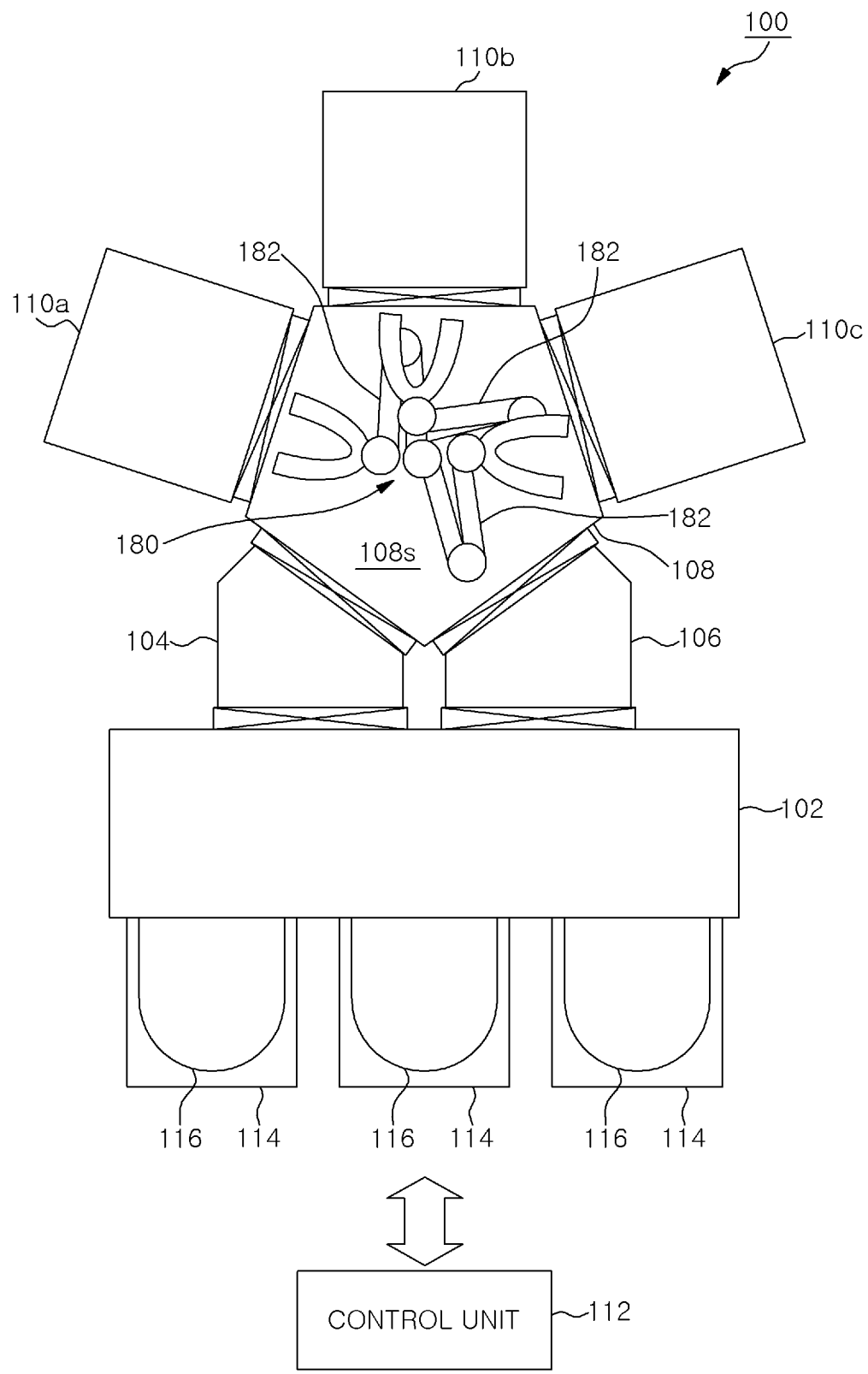
FIG. 1 schematically shows a film forming system according to an embodiment.

Hereinafter, embodiments will be described in detail with reference to the accompanying drawings. Like reference numerals will be given to like or corresponding parts throughout the drawings.

Figure 2:
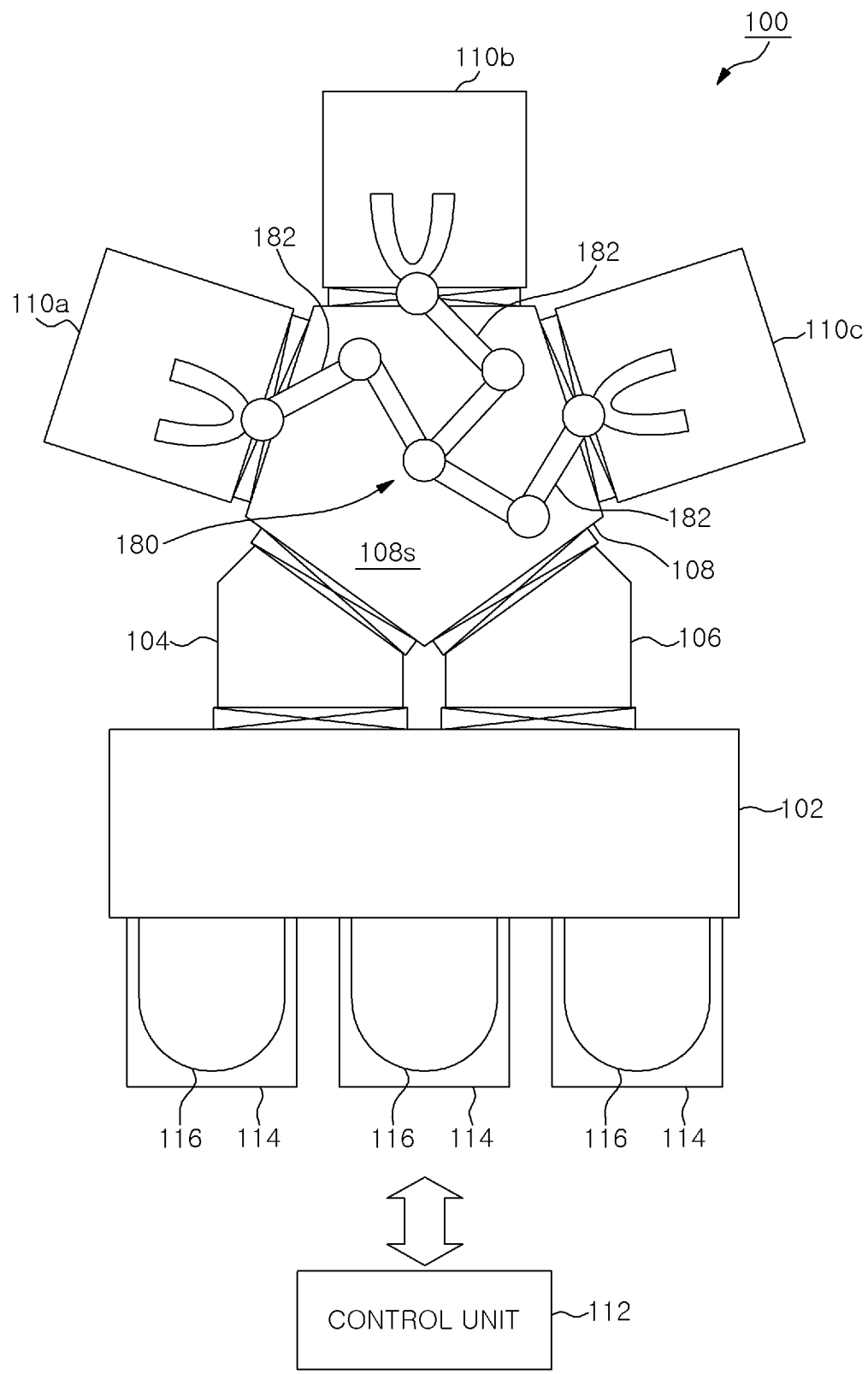
FIG. 2 schematically shows the film forming system according to the embodiment.

FIGS. 1 and 2 schematically show a film forming system according to an embodiment. In FIG. 1, there is illustrated a film forming system in which support portions of a plurality of transfer robots are located in a transfer space. In FIG. 2, there is illustrated a film forming system in which the support portions of the transfer robots are located in chambers of a plurality of processing modules. A film forming system 100 shown in FIGS. 1 and 2 includes a transfer module 108 and one or more processing modules. In one embodiment, the film forming system 100 includes a plurality of processing modules. In the example shown in FIGS. 1 and 2, the film forming system 100 includes three processing modules 110a to 110c as the one or more processing modules. The number of processing modules in the film forming system 100 is not limited to three.

One or more processing modules of the film forming system 100 include a film forming apparatus. In the example shown in FIGS. 1 and 2, at least one of the processing modules 110a to 110c is a film forming apparatus. All the processing modules 110a to 110c may be film forming apparatuses. Alternatively, at least one of the processing modules 110a to 110c may be a film forming apparatus, and at least another one of the processing modules may be a substrate processing apparatus. The substrate processing apparatus is any substrate processing apparatus other than the film forming apparatus of the present disclosure. The substrate processing apparatus may be, e.g., a plasma etching apparatus, an ion beam etching apparatus, a heating apparatus, a cooling apparatus, a chemical vapor deposition apparatus (CVD apparatus), and an atomic layer deposition apparatus (ALD apparatus).

In one embodiment, the film forming system 100 may further include a loader module 102, load-lock modules 104 and 106, and a control unit 112. The loader module 102 transfers a substrate in an atmospheric pressure environment. A plurality of platforms 114 is attached to the loader module 102. A plurality of containers 116 is mounted on the respective platforms 114. Each of the containers 116 is configured to accommodate a plurality of substrates therein. Each of the containers 116 is, e.g., a Front-Opening Unified Pod (FOUP).

The loader module 102 provides a transfer space therein. A pressure in the transfer space of the loader module 102 is set to an atmospheric pressure. The transfer space of the loader module 102 is connected to preliminary decompression chambers of the load-lock modules 104 and 106 via gate valves. The loader module 102 has a transfer device. The transfer device of the loader module 102 includes a transfer robot. The transfer robot has a support portion. The transfer device of the loader module 102 is configured to transfer a substrate mounted on the support portion. The transfer device of the loader module 102 is configured to transfer the substrate between each of the containers 116 and each of the preliminary decompression chambers of the load-lock modules 104 and 106.

The transfer module 108 provides a transfer space 108s therein. The pressure in the transfer space 108s can be decreased. The preliminary decompression chambers of the load-lock modules 104 and 106 are connected to the transfer space 108s of the transfer module 108 via gate valves. The transfer space 108s is connected to spaces in the chambers of the processing modules 110a to 110 c via gate valves.

The transfer module 108 has a transfer device 180. The transfer device 180 includes one or more transfer robots 182. Each of the transfer robots 182 may have a multi-joint arm. The number of transfer robots 182 of the transfer device 180 may be equal to the number of processing modules of the film forming system 100. The number of transfer robots 182 of the transfer device 180 may be smaller than the number of processing modules of the film forming system 100 or the number of film forming apparatuses. In one embodiment, the number of the transfer robots 182 of the transfer device 180 is equal to the number of the film forming apparatuses of the film forming system 100.

One or more transfer robots 182 are configured to transfer a substrate between each of the preliminary decompression chambers of the load-lock modules 104 and 106 and each of the spaces in the chambers of the processing modules 110a to 110c and between the spaces in the chambers of any two processing modules among the processing modules 110a to 110c. In one embodiment, each of the transfer robots 182 is configured to move a shield to be described later to perform scanning in the processing space of the film forming apparatus of the film forming system 100. The transfer device 180 will be described in detail later.

The control unit 112 is configured to control the loader module 102, the load-lock modules 104 and 106, the transfer module 108, and the processing modules 110a to 110c. The control unit 112 is, e.g., a computer device having a processor, a storage device such as a memory or the like, a control signal output interface, and the like. The storage device stores a control program and recipe data. The processor executes the control program stored in the storage device and controls the respective components of the film forming system 100 based on the recipe data. Accordingly, the control unit 112 can control the respective components of the film forming system 100 to perform a film forming method according to an embodiment to be described later.

Figure 3:
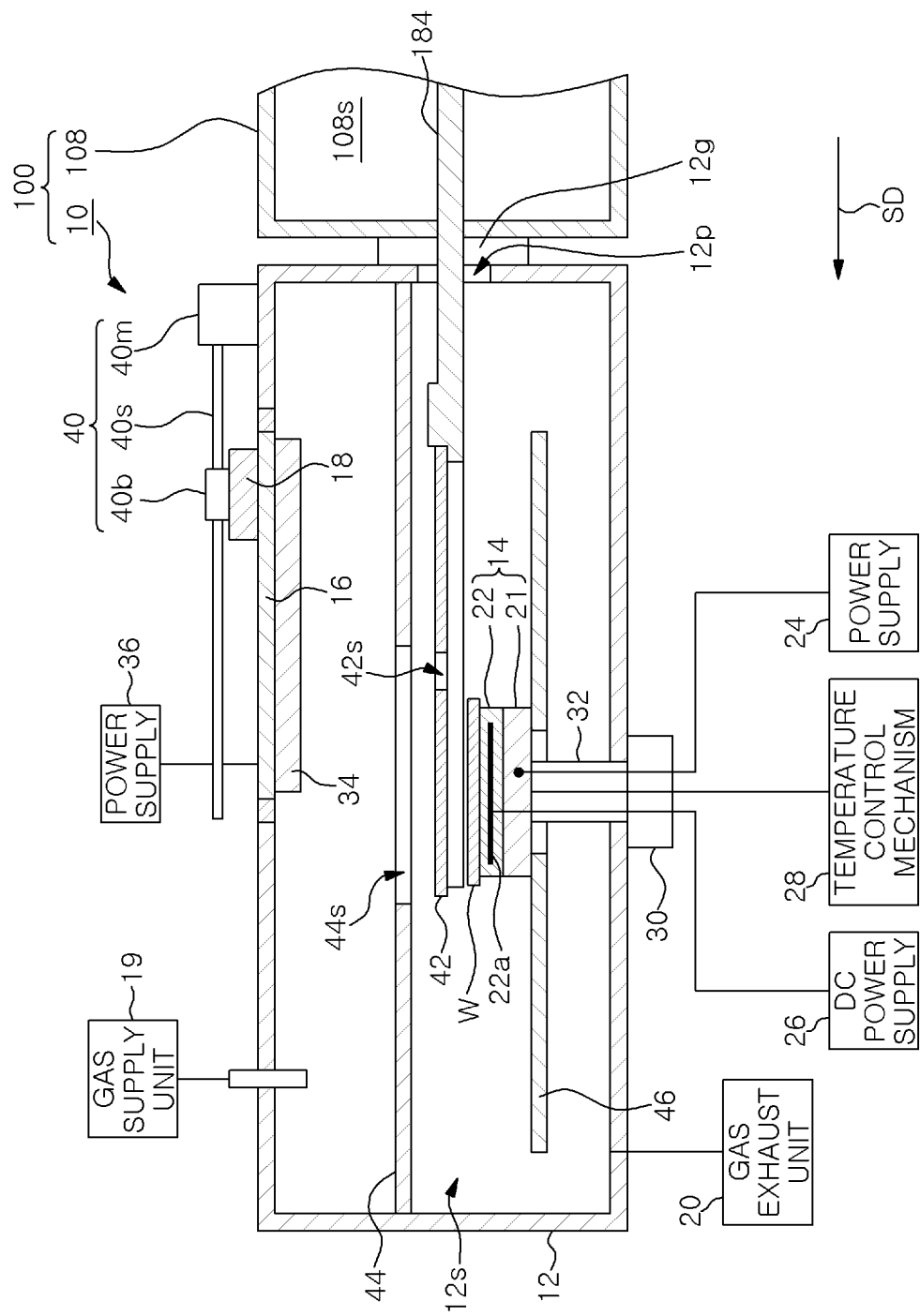
FIG. 3 schematically shows a film forming apparatus according to an embodiment.

Hereinafter, a film forming apparatus of the film forming system 100 will be described. FIG. 3 schematically shows a film forming apparatus according to an embodiment. In FIG. 3, there is illustrated a structure in a vertical cross section of the film forming apparatus according to the embodiment together with a part of a transfer module 108. The film forming apparatus 10 shown in FIG. 3 is employed as one or more processing modules of the film forming system 100. The film forming apparatus 10 includes a chamber 12, a stage 14, a holder 16, and a cathode magnet 18.

The chamber 12 provides a processing space 12s therein. The processing space 12s is connected to a gas supply unit 19 and a gas exhaust unit 20. The gas supply unit 19 is configured to supply a gas (e.g., an inert gas) to the processing space 12s. The gas exhaust unit 20 is configured to exhaust the gas in the processing space 12s and reduce a pressure in the processing space 12s to a specified level. The gas exhaust unit 20 has a pressure controller and one or more depressurization pumps. The pressure controller is, e.g., an automatic pressure control valve. One or more depressurization pumps are, e.g., a turbo molecular pump, a dry pump, and the like.

An opening 12p is formed in the sidewall of the chamber 12. The transfer space 108s and the processing space 12s can be connected to each other through the opening 12p. The substrate W is transferred between the transfer space 108s and the processing space 12s through the opening 12p. The opening 12p can be opened and closed by a gate valve 12g. When the gate valve 12g is opened, the transfer space 108s and the processing space 12s communicate with each other. When the gate valve 12g is closed, the transfer space 108s and the processing space 12s are isolated from each other.

The stage 14 is provided in the processing space 12s. The stage 14 is configured to support the substrate W. In one embodiment, the stage 14 has a base 21 and an electrostatic chuck 22. The base 21 is made of metal (e.g., aluminum). In one embodiment, the base 21 constitutes a lower electrode. A power supply 24 is electrically connected to the base 21. A high frequency bias power or a DC voltage for bias is supplied from the power supply 24 to the base 21.

The electrostatic chuck 22 is provided on the base 21. The substrate W is mounted on the electrostatic chuck 22. The electrostatic chuck 22 is configured to hold the substrate by electrostatic attractive force. The electrostatic chuck 22 has a dielectric main body and an electrode 22a. The electrode 22a is provided in the main body. The electrode 22a is electrically connected to a DC power supply 26. When a DC voltage from the DC power supply 26 is applied to the electrode 22a, electrostatic attractive force is generated between the electrostatic chuck 22 and the substrate W. The substrate W is attracted to and held on the electrostatic chuck 22 by the electrostatic attractive force thus generated.

A temperature control mechanism 28 is connected to the stage 14. The temperature control mechanism 28 may be configured to supply a heat exchange medium to a flow path formed in the base 21. Alternatively, the temperature control mechanism 28 may be configured to supply power to a heater provided in the stage 14.

The stage 14 is connected to a driving mechanism 30 through a support shaft 32. The support shaft 32 extends from the bottom surface of the stage 14 to the outside of the chamber 12. The support shaft 32 is connected to the driving mechanism 30 outside the chamber 12. The driving mechanism 30 is a rotation driving mechanism of one embodiment. The driving mechanism 30 is configured to rotate the stage 14 about the central axis thereof. When the stage 14 rotates, the substrate W mounted on the stage 14 rotates about the center thereof. The driving mechanism 30 includes, e.g., a motor. The driving mechanism 30 may be configured to raise and lower the stage 14.

The holder 16 is provided directly above or obliquely above the stage 14. The holder 16 is configured to hold a target 34 provided in the processing space 12s. The holder 16 constitutes a cathode. The holder 16 is connected to a power supply 36. The power supply 36 is a DC power supply or a high frequency power supply. When a voltage is applied from the power supply 36 to the holder 16 in a state where a gas from the gas supply unit 19 is supplied to the processing space 12s, the gas is excited around the target 34 and plasma is generated. Ions in the plasma are attracted to the target 34 and collide with the target 34. When the ions collide with the target 34, particles are released from the target 34. The released particles are deposited on the substrate W, thereby forming a film on the substrate W.

The cathode magnet 18 is provided outside the chamber 12 with respect to the target 34. In other words, the cathode magnet 18 is provided such that the holder 16 (and the target 34 supported by the holder 16) is located between the stage 14 and the cathode magnet 18. The cathode magnet 18 generates magnetic field near a partial region of the target 34 in the processing space 12s. The plasma is confined by the magnetic field generated by the cathode magnet 18. As a result, particles are released from the partial region of the target 34.

The film forming apparatus 10 further includes a moving mechanism 40. The moving mechanism 40 is a second moving mechanism of one embodiment. The moving mechanism 40 is configured to move the cathode magnet 18 along a scanning direction SD and a direction opposite thereto. The scanning direction SD is one direction along the horizontal plane and substantially parallel to the surface (upper surface) of the substrate W. In the illustrated example, the scanning direction SD becomes farther from the opening 12p. In one example, the moving mechanism 40 includes a motor 40m, a ball screw 40s, and a slide block 40b. The ball screw 40s extends along the scanning direction SD. The ball screw 40s is connected to the motor 40m. The ball screw 40s is screw-coupled to the slide block 40b. The slide block 40b supports the cathode magnet 18. When the ball screw 40s is rotated by the motor 40m, the slide block 40b moves along the scanning direction SD or the direction opposite thereto.

Figure 4A:
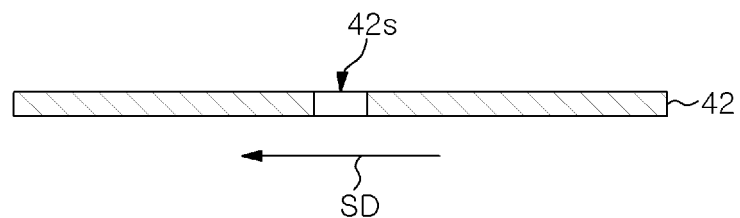
FIG. 4A is a cross sectional view of an exemplary shield.
Figure 4B:
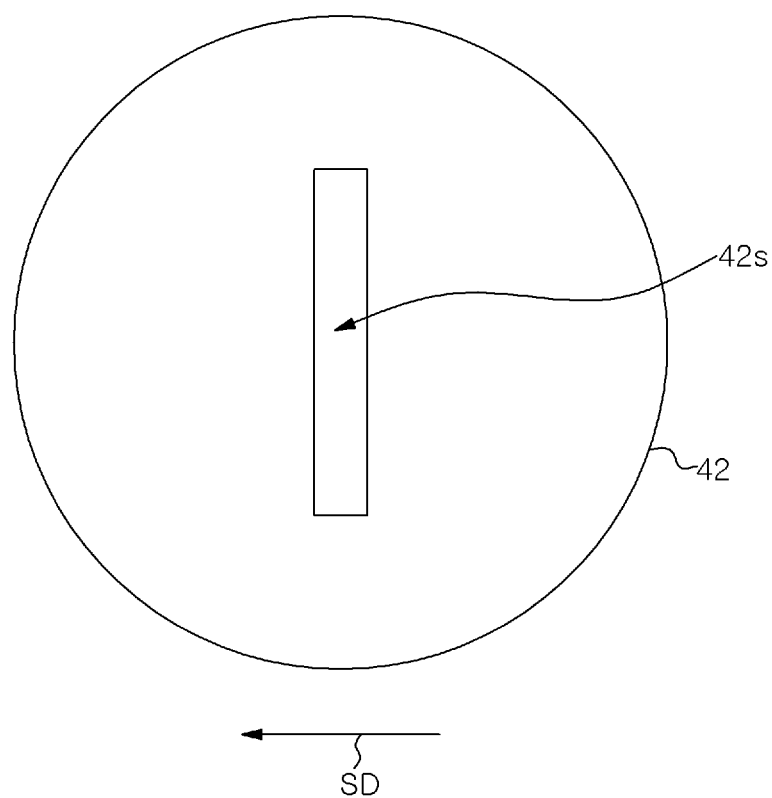
FIG. 4B is a plan view of the shield shown in FIG. 4A.

In the film forming system 100, a shield 42 is used during the film forming process. A slit 42s is formed in the shield 42. The slit 42s is an opening penetrating through the shield 42. The shield 42 is configured to block particles released from the target 34 around the slit 42s. FIG. 4A is a cross sectional view of an exemplary shield. FIG. 4B is a plan view of the shield shown in FIG. 4A. In one example, the shield 42 has a plate shape as shown in FIGS. 3, 4A and 4B. The shield 42 may have a circular shape when seen from the top.

The slit 42s is formed in a longitudinal direction. In other words, the length of the slit 42s in the longitudinal direction is greater than the width of the slit 42s in a direction perpendicular to the longitudinal direction (hereinafter referred to as "widthwise direction"). The slit 42s has a rectangular shape, for example, when seen from the top. During the film forming process, the shield 42 is used in a state where the longitudinal direction of the slit 42s is substantially perpendicular to the scanning direction SD. The length of the slit 42s in the longitudinal direction is greater than the width of the substrate W in the direction parallel to the longitudinal direction in the film forming process. The width of the slit 42s in the widthwise direction is smaller than the width of the substrate W in a direction parallel to the widthwise direction in the film forming process.

In the illustrated example, the slit 42s is formed at the center of the shield 42 in a direction parallel to the widthwise direction. However, the slit 42s may be formed at a region biased toward the edge side of the shield 42 with respect to the center of the shield 42 in a direction parallel to the widthwise direction.

When the shield 42 is not used in the film forming apparatus 10, the shield 42 may be accommodated in any one of the processing modules 110a to 110c and the loadlock modules 104 and 106. Alternatively, the shield 42 may be disposed in a storage region in the chamber 12 in the case of not using the shield 42 in the film forming apparatus 10.

Figure 5A:
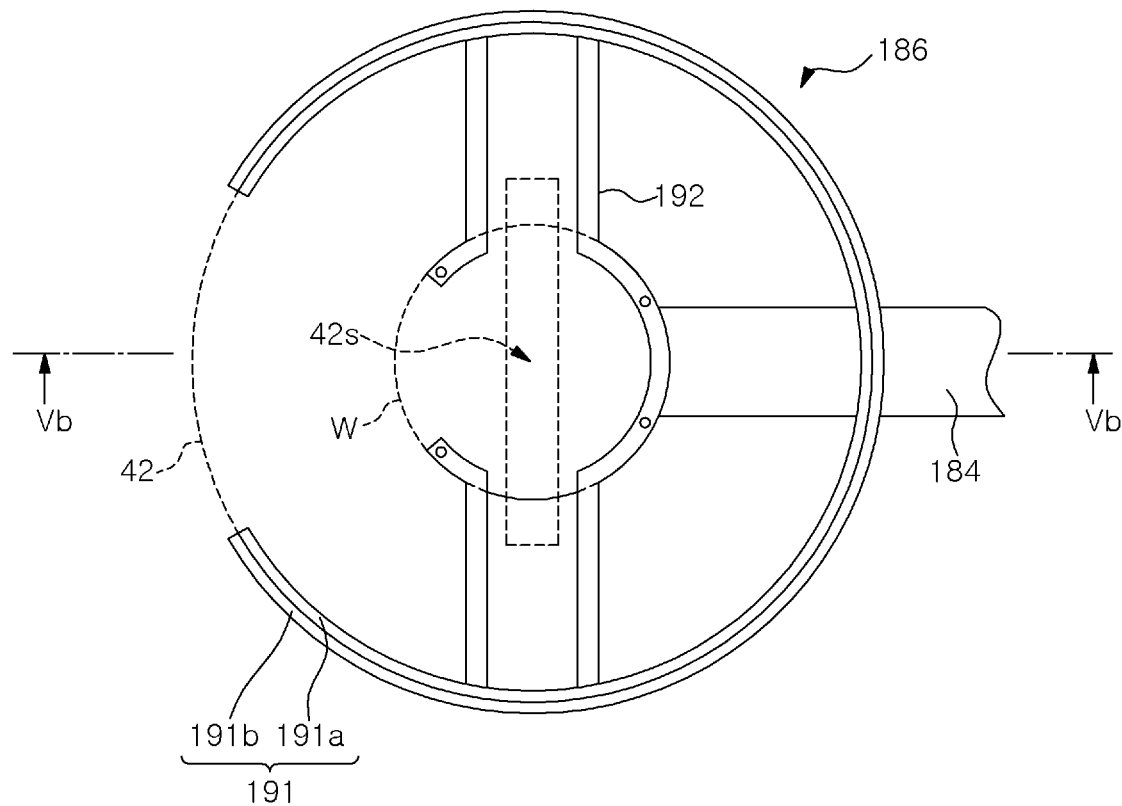
FIG. 5A is a plan view of an exemplary transfer robot.
Figure 5B:
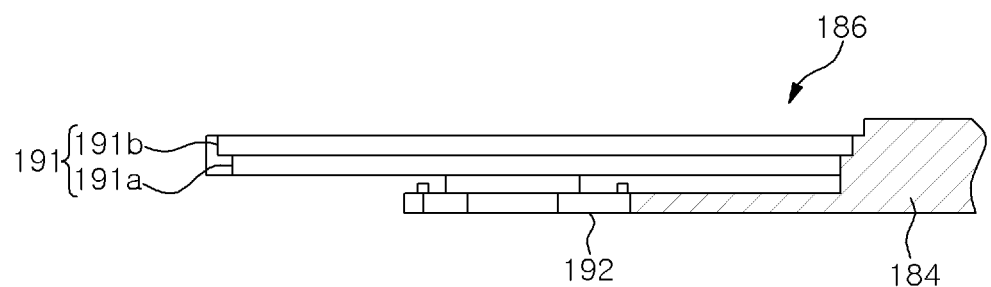
FIG. 5B is a cross sectional view taken along line Vb-Vb of FIG. 5A.

In performing the film formation process using the film forming system 100, the transfer device 180 moves the shield 42 in the scanning direction SD between the stage 14 and the target 34. In other words, the transfer device 180 constitutes a first moving mechanism. Specifically, the transfer robot 182 moves the shield 42 in the scanning direction SD. The support portion of the transfer robot 182 is configured to support the shield 42 and the substrate W. Hereinafter, the support portion of the transfer robot 182 of the transfer device 180 will be described with reference to FIGS. 3, 5A and 5B. FIG. 5A is a plan view of an exemplary transfer robot. FIG. 5B is a cross sectional view taken along a line Vb-Vb of FIG. 5A.

The transfer robot 182 has a support portion 186. The support portion 186 is provided at a leading end of an arm 184 of the transfer robot 182. The support portion 186 has a first support portion 191 and a second support portion 192. The first support portion 191 is configured to support the shield 42. The first support portion 191 includes a lower portion 191a and an upper portion 191b. Each of the lower part 191a and the upper portion 191b has a shape conforming to the edge of the shield 42. When the shield 42 has a circular shape when seen from the top, each of the lower portion 191a and the upper portion 191b extends along an arc. The upper portion 191b extends on the lower portion 191a. The lower portion 191a has an upper surface. The upper portion 191b exposes the upper surface of the lower portion 191a. The upper surface of the lower portion 191a is in contact with the bottom surface of the edge of the shield 42. The upper portion 191b has an inner peripheral surface. The inner peripheral surface of the upper portion 191b extends, at the outside of the edge of the shield 42, to face the edge of the shield 42. The inner peripheral surface of the upper portion 191b restricts the movement of the shield 42 along the horizontal direction on the first support portion 191.

The second support portion 192 is configured to support the substrate W. When the substrate W has a circular shape when seen from the top, the second support portion 192 may extend along an arc to support the edge of the substrate W. In that case, the second support portion 192 extends to avoid a path of particles from the target 34 to the substrate W through the slit 42s. For example, the second support portion 192 includes a portion extending substantially in parallel to the longitudinal direction of the slit 42s to avoid a region below the region where the slit 42s is located. In one embodiment, the second support portion 192 is connected to the first support portion 191 on both sides in a direction substantially parallel to the longitudinal direction of the slit 42s. By using the configuration in which both sides of the second support portion 192 are connected to the first support portion 191, the stiffness of the support portion 186 is enhanced.

Referring back to FIG. 3, in one embodiment, the forming apparatus 10 may further include shields 44 and 46. The shield 44 has a substantially plate shape. The shield 44 extends between the stage 14 and the target (or holder 16). In the processing space 12s, the shield 42 moves in a region below the shield 44. An opening 44s is formed in the shield 44. The opening 44s exposes the substrate W (or the stage 14) to the target 34. The shield 44 prevents particles from the target 34 from reaching a position below the shield 44 around the opening 44s. The shield 46 extends from the stage 14 toward the sidewall of the chamber 12. The shield 46 has a substantially plate shape. The shield 46 prevents particles from the target 34 from reaching a position below the shield 46 around the stage 14.

Figure 6:
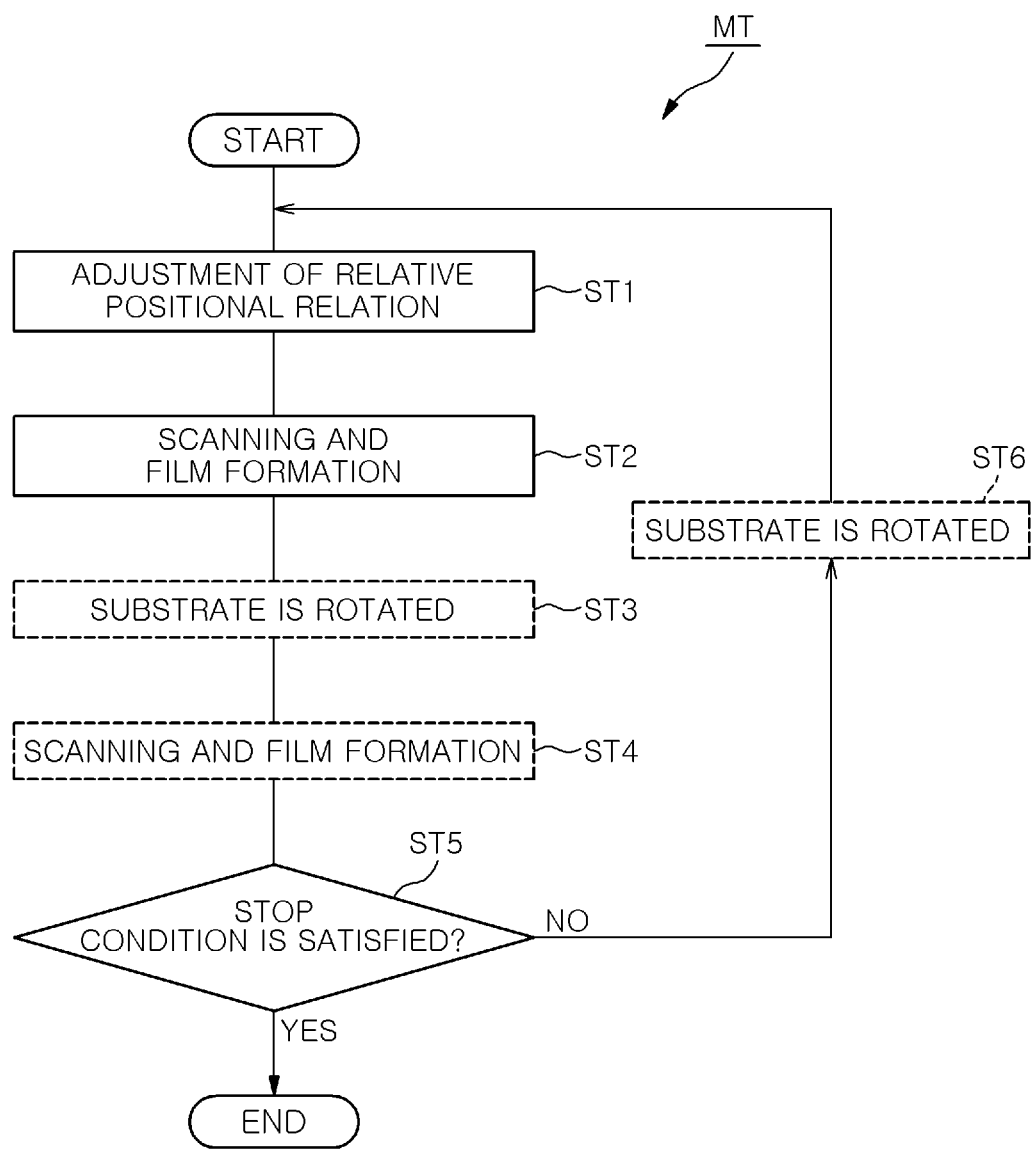
FIG. 6 is a flowchart illustrating a method for forming a film on a substrate according to an embodiment.
Figure 7:
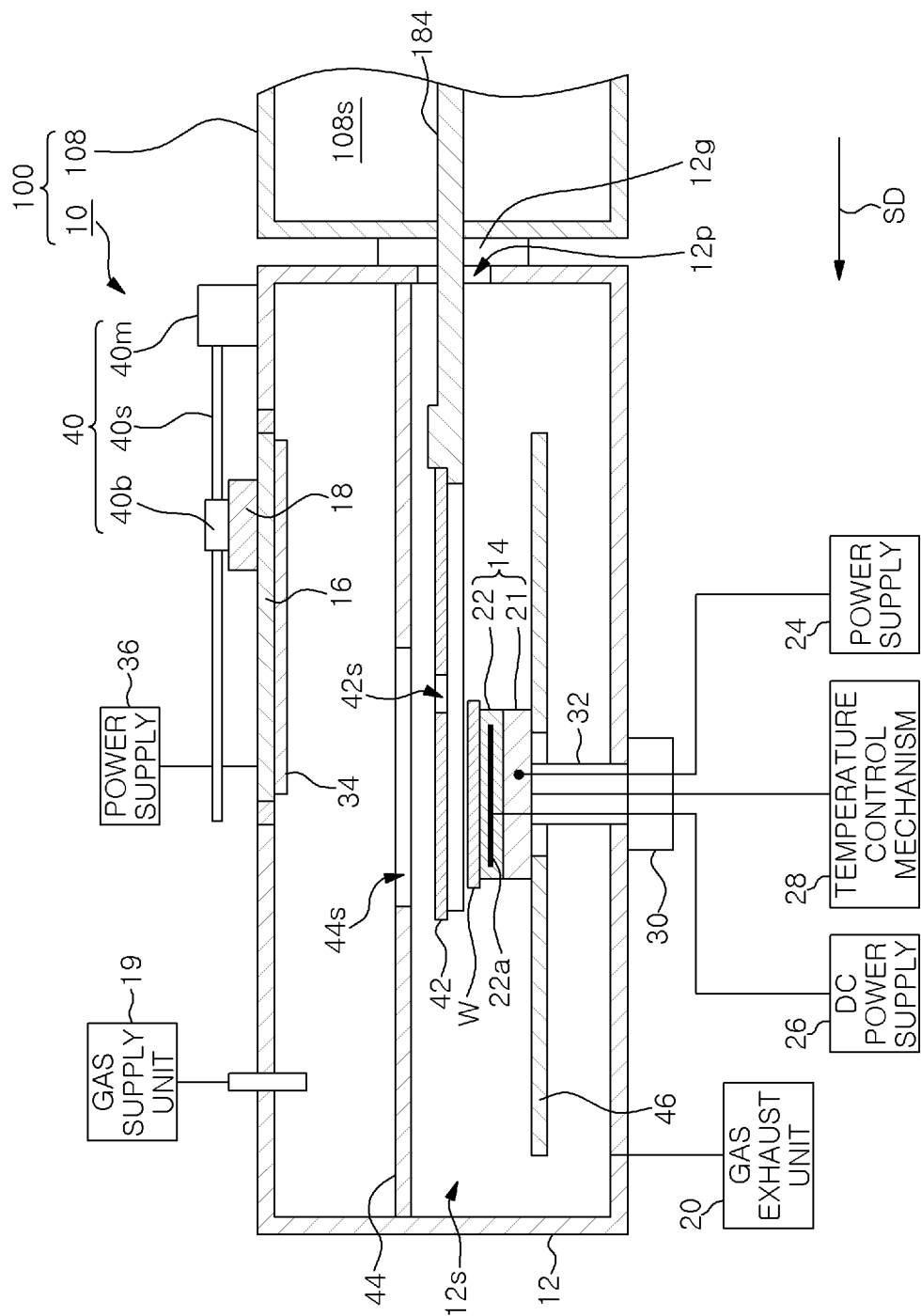
FIG. 7 shows a state in a chamber of the film forming apparatus at the time of performing a film formation process.
Figure 8:
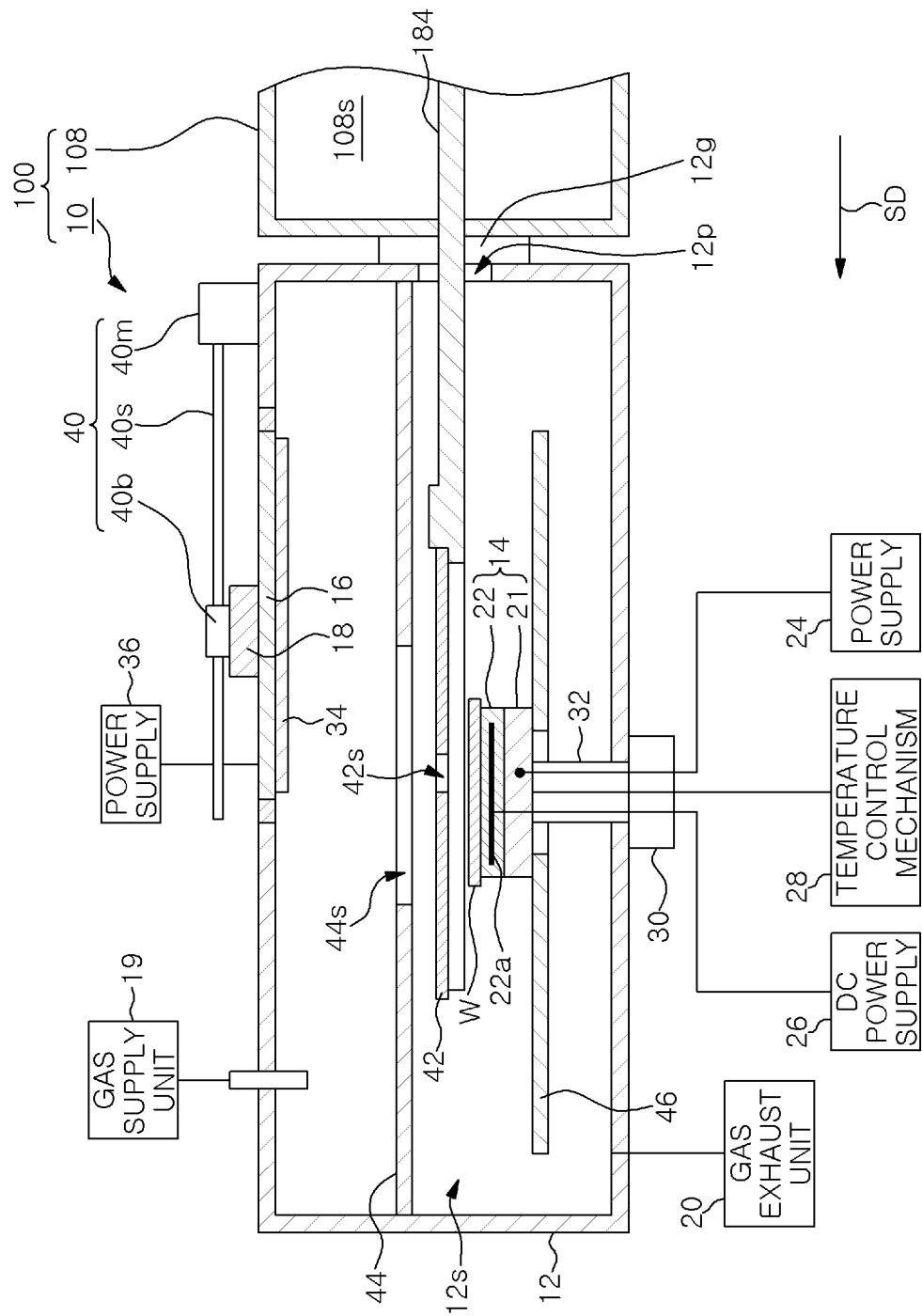
FIG. 8 shows a state in the chamber of the film forming apparatus at the time of performing the film formation process.
Figure 9:
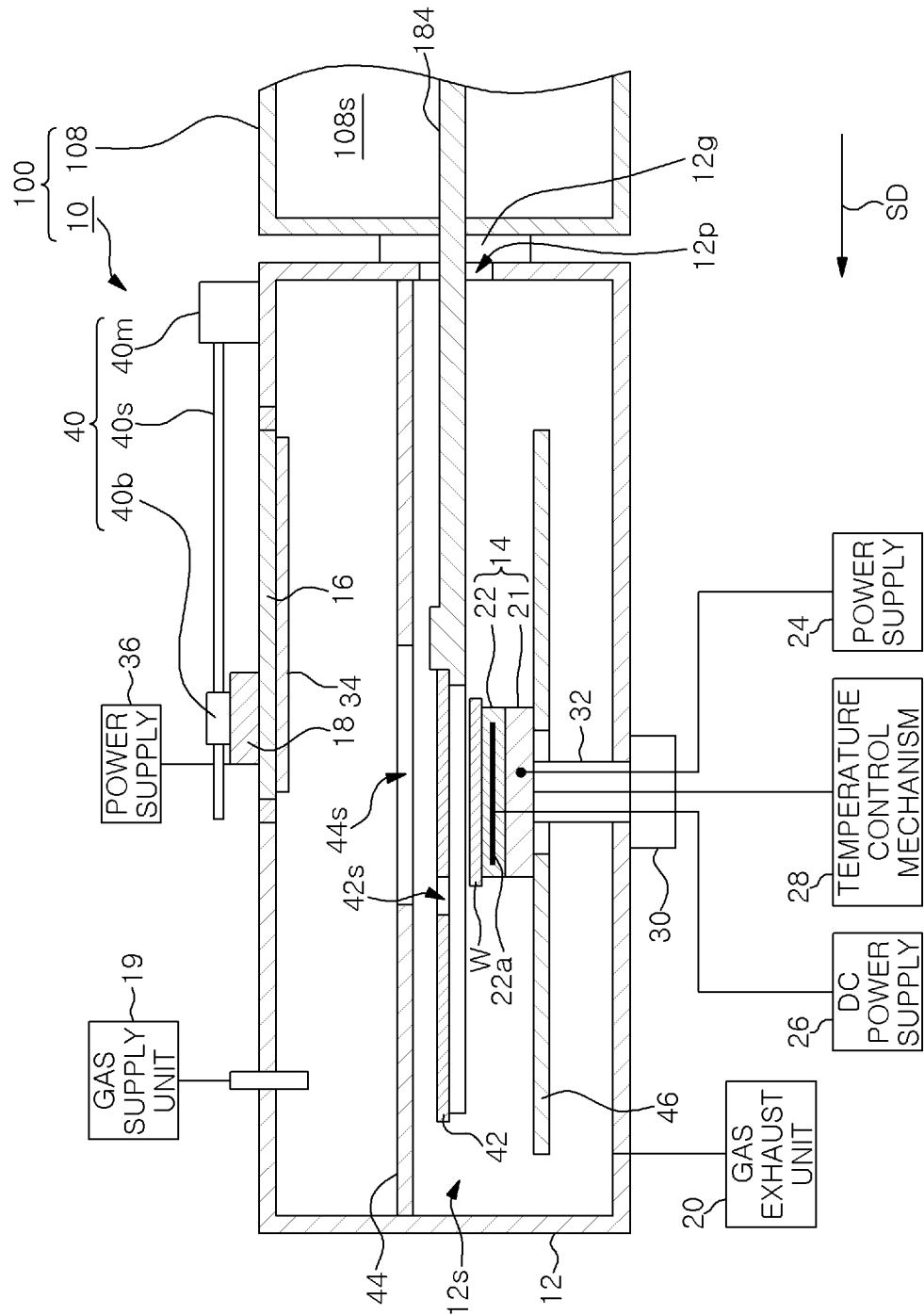
FIG. 9 shows a state in the chamber of the film forming apparatus at the time of performing the film formation process.

Hereinafter, the operation of the film forming system 100 at the time of performing the film formation process will be described. A method of forming a film on a substrate according to one embodiment will be described with reference to FIGS. 6 to 9. FIG. 6 is a flowchart illustrating a method of forming a film on a substrate according to one embodiment. FIGS. 7 to 9 show states in the chamber of the film forming apparatus at the time of performing the film forming process. In a method MT shown in FIG. 6, before a film is formed on the substrate W, the substrate W is supported by the second support portion 192 of the transfer robot 182 and mounted on the stage 14 by the transfer robot 182. Then, the shield 42 is supported by the first support portion 191 of the transfer robot 182 and transferred into the processing space 12s. As described above, during the film forming process, the longitudinal direction of the slit 42s of the shield 42 is substantially perpendicular to the scanning direction SD in the processing space 12s.

In method MT, a step ST1 is executed. In the step ST1, the relative positional relation between the slit 42s and the cathode magnet 18 along the scanning direction SD is adjusted. In the step ST1, the relative positional relation between the slit 42s and the cathode magnet 18 is set such that the particles from the target 34 are incident on the substrate W at a desired incident angle (see, e.g., the relative positional relation shown in FIG. 3). In the step ST1, the moving mechanism 40 and the transfer device 180 (first moving mechanism) are controlled by the control unit 112. Specifically, the transfer robot 182 of the transfer device 180 is controlled to obtain the relative positional relation, and the position of the slit 42s in the scanning direction SD is set. Further, the moving mechanism 40 is controlled to obtain the relative positional relation, and the position of the cathode magnet 18 in the scanning direction SD is set.

Next, in a step ST2, a film containing particles from the target 34 is formed on the substrate W. In the step ST2, the control unit 112 controls the gas supply unit 19 to supply a gas into the processing space 12s. In the step ST2, the control unit 112 controls the gas exhaust unit 20 to set the pressure in the processing space 12s to a specified level. In the step ST2, the control unit 112 controls the power supply 36 to apply a voltage to the holder 16 (i.e., the cathode).

In the step ST2, in a state where the substrate W is mounted on the stage 14, the shield 42 and the cathode magnet 18 are moved along the scanning direction SD during the release of the particles from the target 34. In the step ST2, the cathode magnet 18 and the shield 42 are moved along the scanning direction SD to supply the particles from the target 34 to the entire surface of the substrate W (see FIGS. 7 to 9). In the step ST2, the transfer device 180 (first moving mechanism) and the moving mechanism 40 are controlled by the control unit 112. Specifically, the transfer robot 182 of the transfer device 180 and the moving mechanism 40 are controlled to move the shield 42 and the cathode magnet 18 along the scanning direction SD while maintaining the relative positional relation between the slit 42s and the cathode magnet 18.

Next, in the method MT, a step ST3 may be executed. In the step ST3, the substrate W is rotated about the center thereof by a predetermined angle after the execution of the step ST2. The predetermined angle may be 180°. In the step ST3, the control unit 112 controls the driving mechanism 30 to rotate the substrate W by a predetermined angle by rotating the stage 14.

In the method MT, a step ST4 may be executed after the step ST2 or the step ST3. In the step ST4, as in the step ST2, a film containing particles from the target 34 is formed on the substrate W. Specifically, in the step ST4, the control unit 112 controls the gas supply unit 19 to supply a gas into the processing space 12s. In the step ST4, the control unit 112 controls the gas exhaust unit 20 to set a pressure in the processing space 12s to a specified level. In the step ST4, the control unit 36 controls the power supply 36 to apply a voltage to the holder 16 (i.e., the cathode).

In the step ST4, in a state where the substrate W is mounted on the stage 14, the shield 42 and the cathode magnet 18 are moved along the direction opposite to the scanning direction SD during the release of the particles from the target 34. In the step ST4, the shield 42 and the cathode magnet 18 are moved along the direction opposite to the scanning direction SD to supply the particles from the target 34 to the entire surface of the substrate W. In the step ST4, the transfer device 180 (first moving mechanism) and the moving mechanism 40 are controlled by the control unit 112. Specifically, the transfer robot 182 of the transfer device 180 and the moving mechanism 40 are controlled to move the shield 42 and the cathode magnet 18 in the direction opposite to the scanning direction SD while maintaining the relative positional relation between the slit 42s and the cathode magnet 18, Next, in the method MT, a step ST5 may be executed. In the step ST5, it is determined whether or not a stop condition is satisfied. The stop condition is satisfied when the number of executions of the sequence including the step ST2 has reached a predetermined number. This sequence may further include the step ST4 or the steps ST3 and ST4. If it is determined in the step ST5 that the stop condition is not satisfied, the sequence is executed again. When the sequence includes the step ST3, a step ST6 is executed before the transition from the step ST5 to the step ST1. In the step ST6, the substrate W is rotated about the center thereof by a predetermined angle. The predetermined angle may be 180°. In the step ST6, the control unit 112 controls the driving mechanism 30 to rotate the substrate W by a predetermined angle by rotating the stage 14. On the other hand, if it is determined in the step ST5 that the stop condition is satisfied, the method MT is terminated.

In the above-described film forming system 100, the relative positional relation between the slit 42s of the shield 42 and the cathode magnet 18 can be adjusted by using the transfer device 180 (first moving mechanism) and the moving mechanism 40 (second moving mechanism). The incident angle of the particles from the target 34 with respect to the substrate W is determined by the relative positional relation between the slit 42s of the shield 42 and the cathode magnet 18. Therefore, in accordance with the film forming system 100, the incident angle of the particles from the target 34 with respect to the substrate can be adjusted to a desired angle. Further, the shield 42 and the cathode magnet 18 can be moved along the scanning direction SD by the transfer device 180 (first moving mechanism) and the moving mechanism 40 (second moving mechanism) while maintaining the adjusted relative positional relation. Therefore, in accordance with the film forming system 100, the particles from the target 34 can incident on the entire surface of the substrate W at a desired incident angle.

Figure 10:
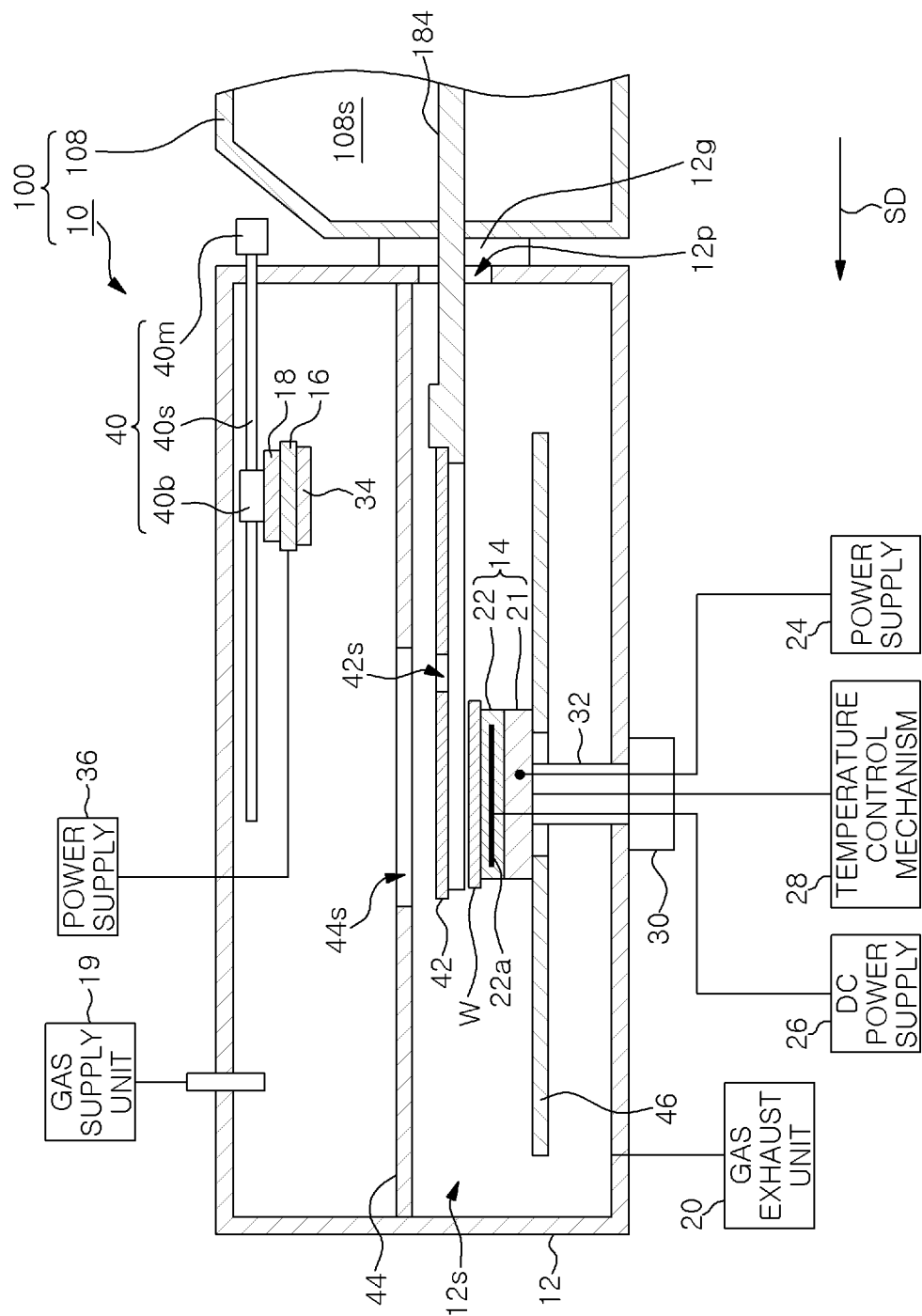
FIG. 10 schematically shows a film forming system according to another embodiment.

Hereinafter, FIG. 10 will be referred to. FIG. 10 schematically shows a film forming system according to another embodiment. A film forming system 100B shown in FIG. 10 includes a film forming apparatus 10B instead of the film forming apparatus 10 and includes a transfer module 108B instead of the transfer module 108. The transfer module 108B has the same configuration as that of the transfer module 108. The film forming apparatus 10B includes a moving mechanism 40B instead of the moving mechanism 40. The other configurations of the film forming system 100B are the same as those of the film forming system 100. The moving mechanism 40B is configured to move the cathode magnet 18 and the holder 16 along the scanning direction SD and the direction opposite thereto while maintaining the relative positional relation therebetween.

In one example, the moving mechanism 40B is configured to move the cathode magnet 18 and the holder 16 together. Specifically, the moving mechanism 40B includes a motor 40m, a ball screw 40s, and a slide block 40b. The ball screw 40s extends along the scanning direction SD. The ball screw 40s is connected to the motor 40m. The ball screw 40s is screw-coupled to the slide block 40b. The slide block 40b supports the cathode magnet 18. The slide block 40b supports the holder 16 directly or via the cathode magnet 18. The holder 16 holds a target 34 provided in the processing space 12s. When the ball screw 40s is rotated by the motor 40m, the slide block 40b moves along the scanning direction SD or the direction opposite thereto. As a result, the cathode magnet 18 supported by the slide block 40b and the target 34 supported by the holder 16 move along the scanning direction SD or the direction opposite thereto. The above-described method MT can also be performed by using the film forming system 100B.

In the film forming system 100 or the film forming system 100B, the film forming process of the method MT may be performed by using a plurality of processing modules that are film forming apparatuses (the film forming apparatuses 10 or the film forming apparatuses 10B). In other words, the plurality of shields 42 can be respectively moved by the plurality of transfer robots 182 of the transfer device 180 in the scanning direction and the direction opposite thereto in the chambers of the plurality of processing modules (see FIG. 2).

When the transfer robot 182 has a plurality of support portions 186 same as the above-described support portions 186 at a leading end of the arm 184 and a plurality of stages 14 is provided in the processing space 12s of the film formation apparatus, a plurality of shields 42 supported by the plurality of support portions 186 can be scanned along the scanning direction SD in a state where a plurality of substrates are respectively mounted on a plurality of stages 14. In other words, film forming processes for a plurality of substrates can be simultaneously performed in one film forming apparatus.

In the film forming system 100 and the film forming system 100B, the shield 42 is moved by the transfer device 180 during the film forming process. However, in another embodiment, the shield 42 may be moved by a dedicated or common moving mechanism different from the transfer device 180 during the film forming process. For example, the transfer module 108 may have a transfer robot different from the transfer robot 182 for the substrate W, and the shield 42 may be moved by the corresponding transfer robot during the film forming process.

Figure 11A:
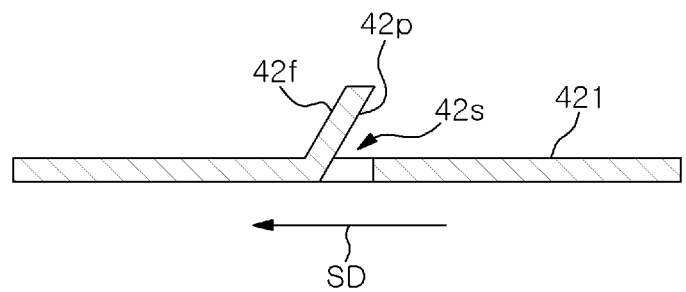
FIG. 11A is a cross sectional view of another shield.
Figure 11B:
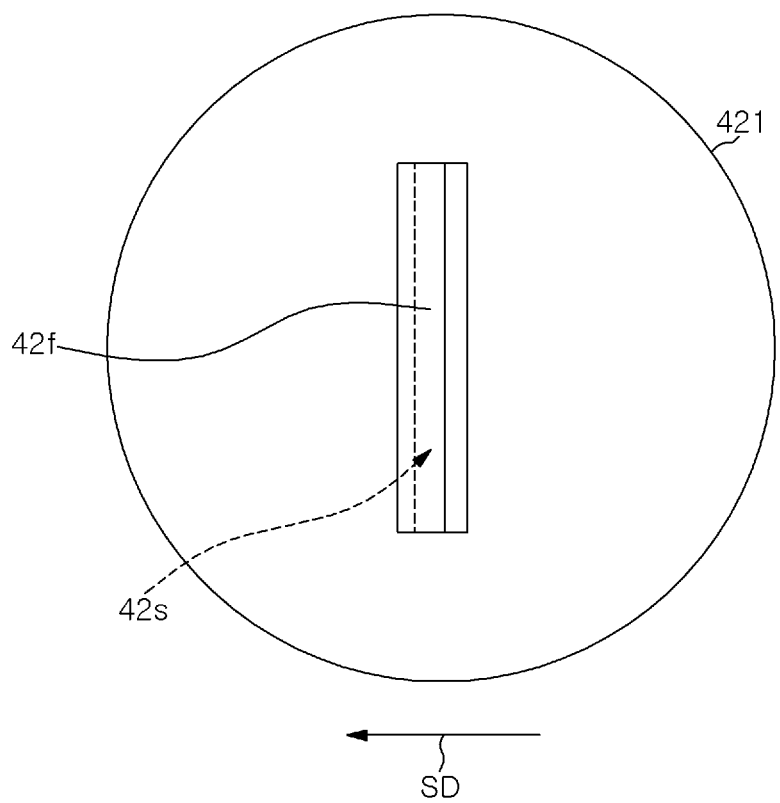
FIG. 11B is a plan view of the shield shown in FIG. 11A.

Hereinafter, several shields that can be used in the film forming system 100 instead of the shield 42 will be described. FIG. 11A is a cross sectional view of another shield. FIG. 11B is a plan view of the shield shown in FIG. 11A. A shield 421 shown in FIGS. 11A and 11B can be used in the film forming system 100, instead of the shield 42. The shield 421 has a substantially plate shape. The shield 421 may have a circular shape when seen from the top. A slit 42s is formed in the shield 421, as the slit 42s is formed in the shield 42.

The shield 421 provides a surface 42p. The surface 42p extends in a direction toward the cathode magnet 18 from at least a part of the edge of the shield 421 which defines the slit 42s. In the illustrated example, the surface 42p extends in a direction toward the cathode magnet 18 from the edge of the shield 421 which defines the slit 42s. The edge extends along the slit 42s in parallel to the longitudinal direction of the slit 42s. The shield 421 includes a plate-shaped fin 42f having a surface 42p. The fin 42f has a plate shape. In the case of using the shield 421, the range of the incident angle of the particles from the target 34 with respect to the substrate W is limited and, thus, the variation of the incident angle of the particles from the target 34 with respect to the substrate W is reduced.

Figure 12A:
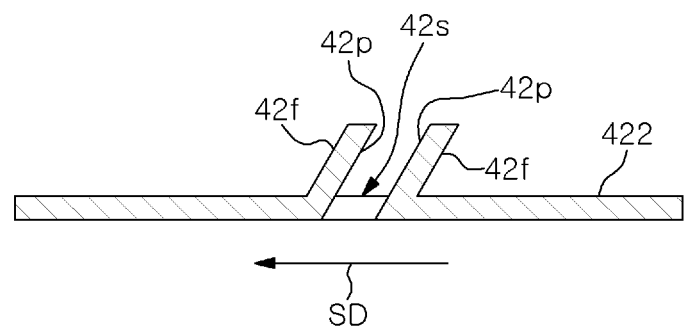
FIG. 12A is a cross sectional view of still another shield.
Figure 12B:
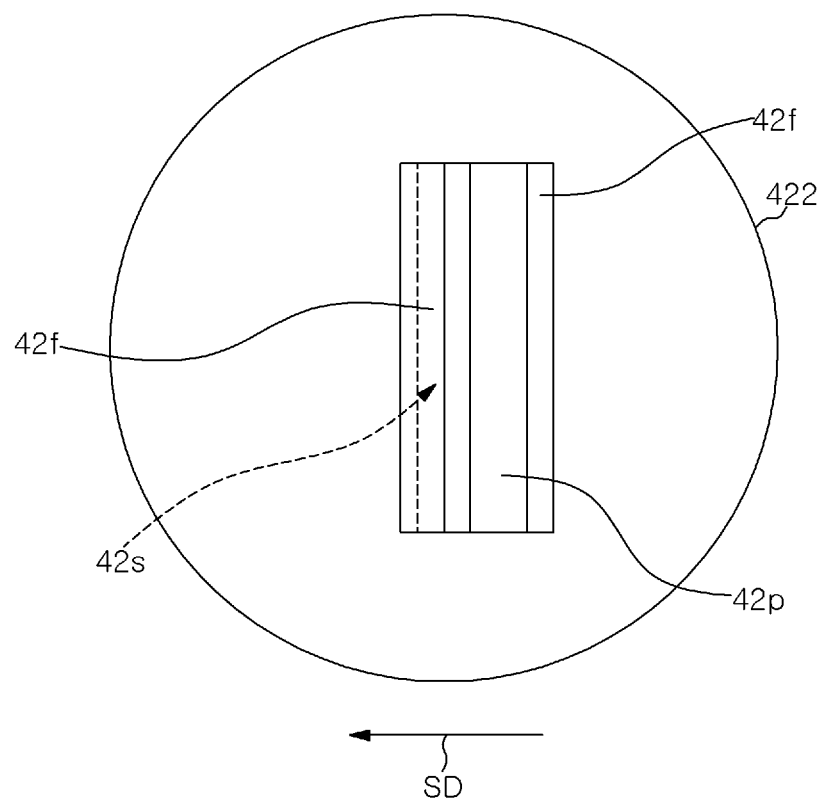
FIG. 12B is a plan view of the shield shown in FIG. 12A.

FIG. 12A is a cross sectional view of still another shield. FIG. 12B is a plan view of the shield shown in FIG. 12A. The shield 422 shown in FIGS. 12A and 12B can be used in the film forming system 100, instead of the shield 42. The shield 422 has a substantially plate shape. The shield 422 may have a circular shape when seen from the top. A slit 42s is formed in the shield 422, as the slit 42s is formed in the shield 42.

The shield 422 provides a pair of surfaces 42p. The surfaces 42p extend in a direction toward the cathode magnet 18 from a pair of edges of the shield 422 which define the slit 42s. The edges of the shield 422 extend along the slit 42s in parallel to the longitudinal direction of the slit 42s. The shield 422 includes, e.g., a pair of fins 42f providing the pair of surfaces 42p. Each of the fins 42f has a plate shape. In the case of using the shield 422, the range of the incident angle of the particles from the target 34 with respect to the substrate W is further limited and, thus, the varication of the incident angle of the particles from the target 34 with respect to the substrate W is further reduced.

Figure 13A:
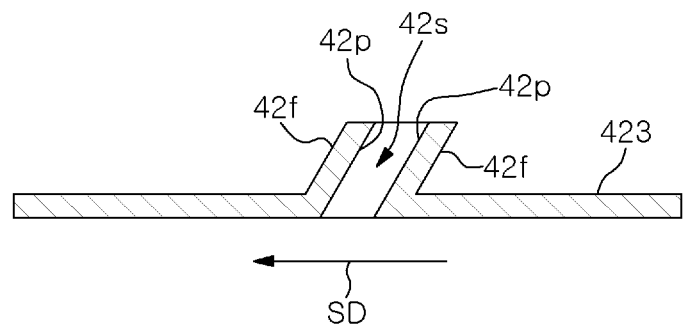
FIG. 13A is a cross sectional view of further still another shield.
Figure 13B:
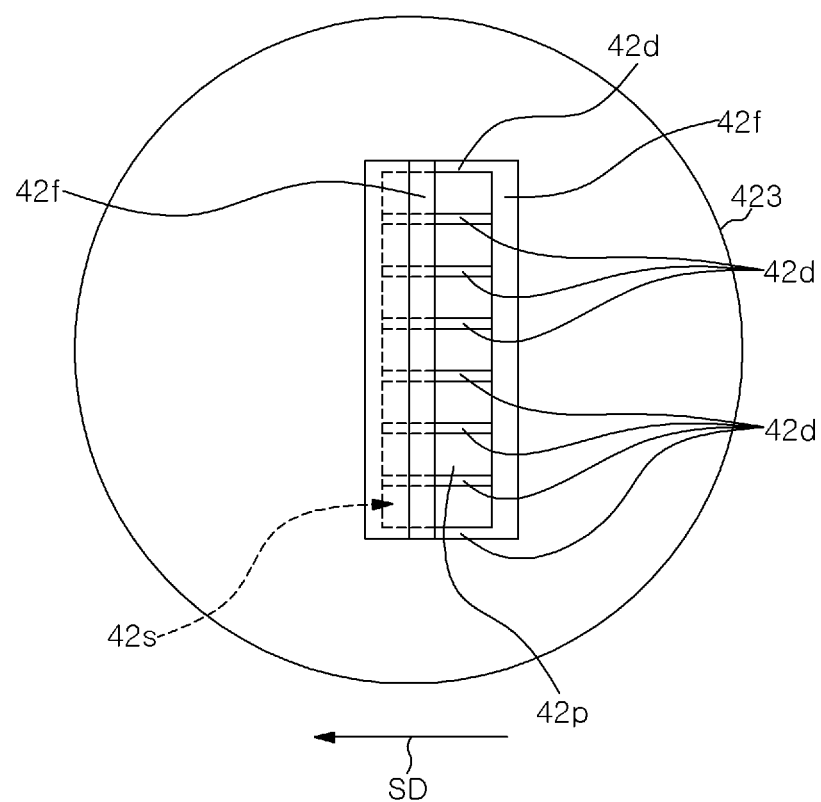
FIG. 13B is a plan view of the shield shown in FIG. 13A.

FIG. 13A is a cross sectional view of further still another shield. FIG. 13B is a plan view of the shield shown in FIG. 13A. The shield 423 shown in FIGS. 13A and 13B can be used in the film forming system 100, instead of the shield 42. The shield 423 has the same configuration as that of the shield 422. The shield 423 further has a plurality of partition walls 42d. The partition walls 42d extend between the pair of surfaces 42p in a direction perpendicular to the longitudinal direction of the slit 42s, i.e., in a direction substantially parallel to the widthwise direction. The partition walls 42d are provided substantially in parallel to each other. In the case of using the shield 423, the range of the incident angle of the particles from the target 34 with respect to the substrate W is further limited and, thus, the variation of the incident angle of the particles from the target 34 with respect to the substrate W is further reduced.

Figure 14:
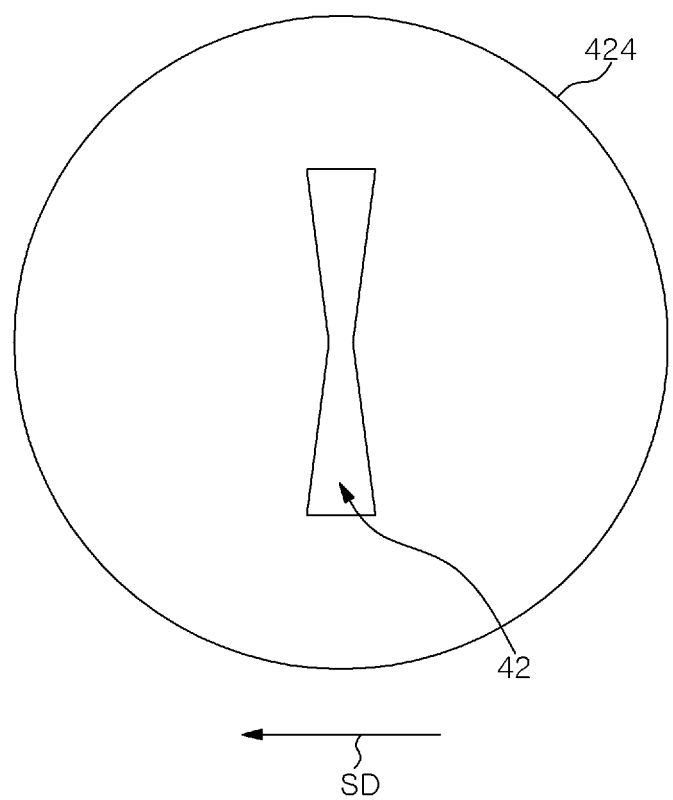
FIG. 14 is a plan view of further still another shield.

FIG. 14 is a plan view of further still another shield. A shield 424 shown in FIG. 14 may be used in the film forming system 100, instead of the shield 42. The shield 424 has a substantially plate shape. The shield 424 may have a circular shape when seen from the top. The slit 42s of the shield 424 is formed in a longitudinal direction. During the film forming process, the shield 424 is used in a state where the longitudinal direction of the slit 42s is substantially perpendicular to the scanning direction SD. The width of the slit 42s of the shield 424 in a direction (widthwise direction) perpendicular to the longitudinal direction increases from the center of the slit 42s toward both ends of the slit 42s in the longitudinal direction. In the case of using the shield 424, the variation in the thickness of the film formed on the substrate W in a direction perpendicular to the scanning direction SD (i.e., the longitudinal direction of the slit 42s) is further reduced.

Figure 15:
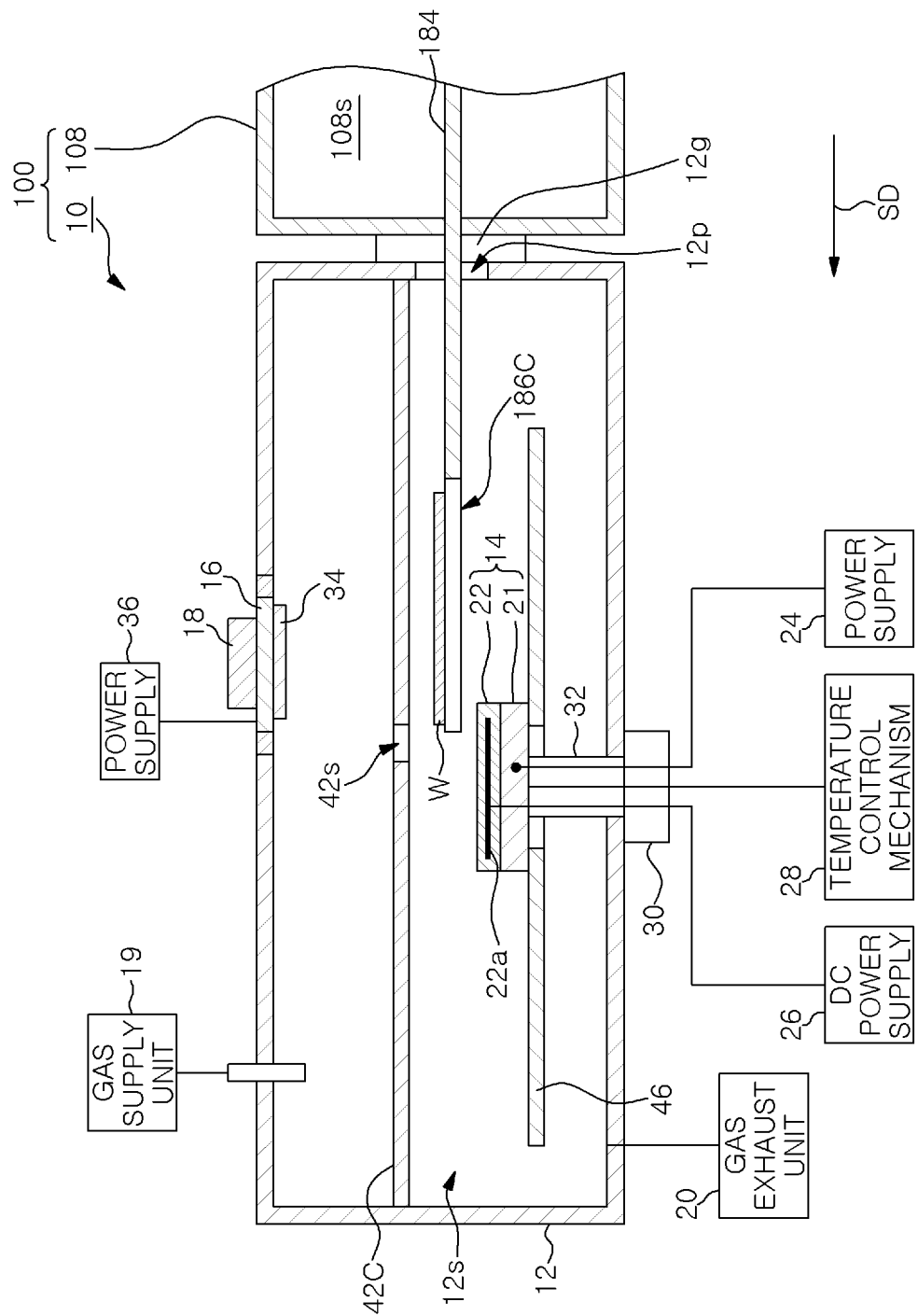
FIG. 15 schematically shows a film forming system according to still another embodiment.
Figure 16:
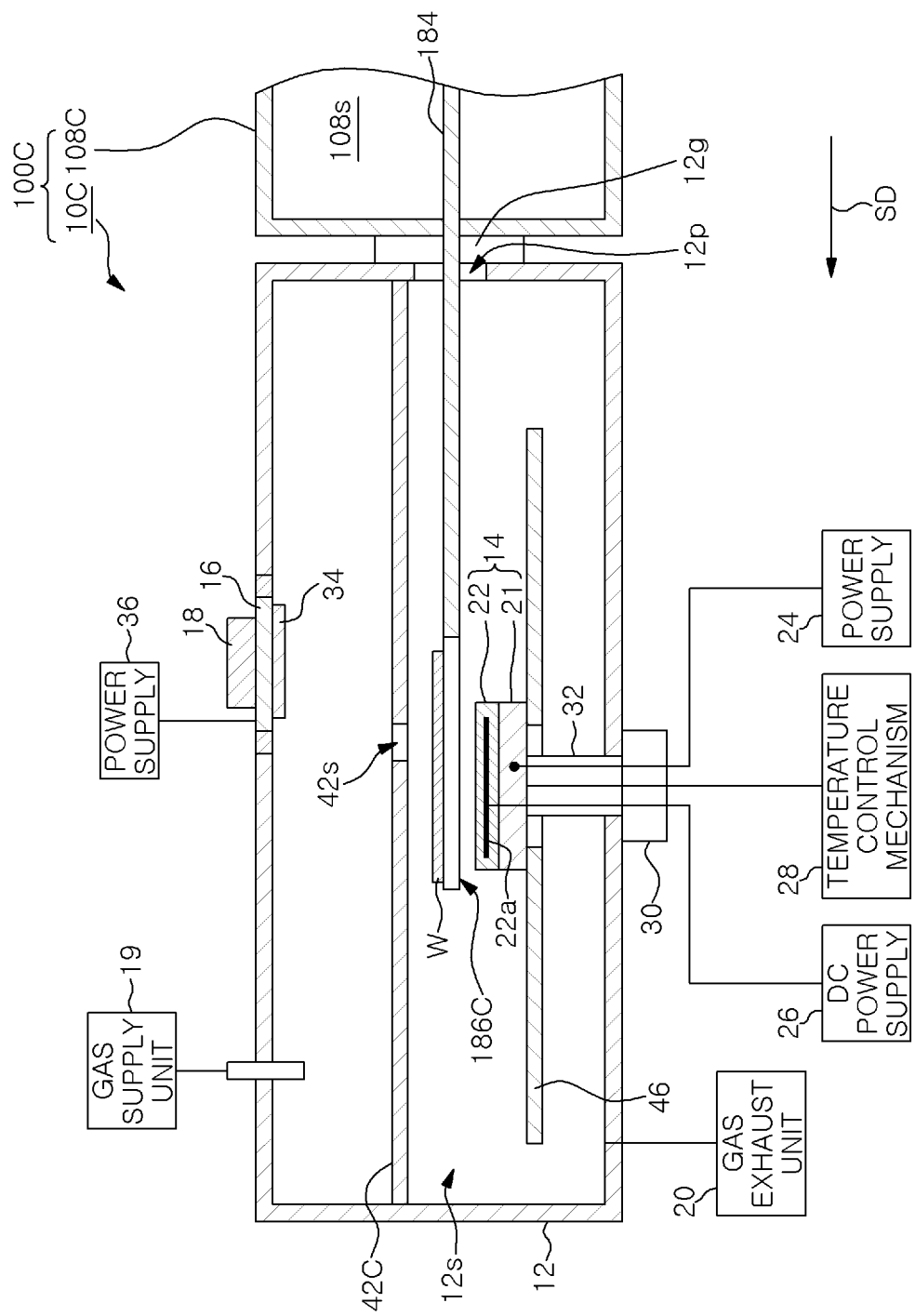
FIG. 16 schematically shows the film forming system according to still another embodiment.
Figure 17:
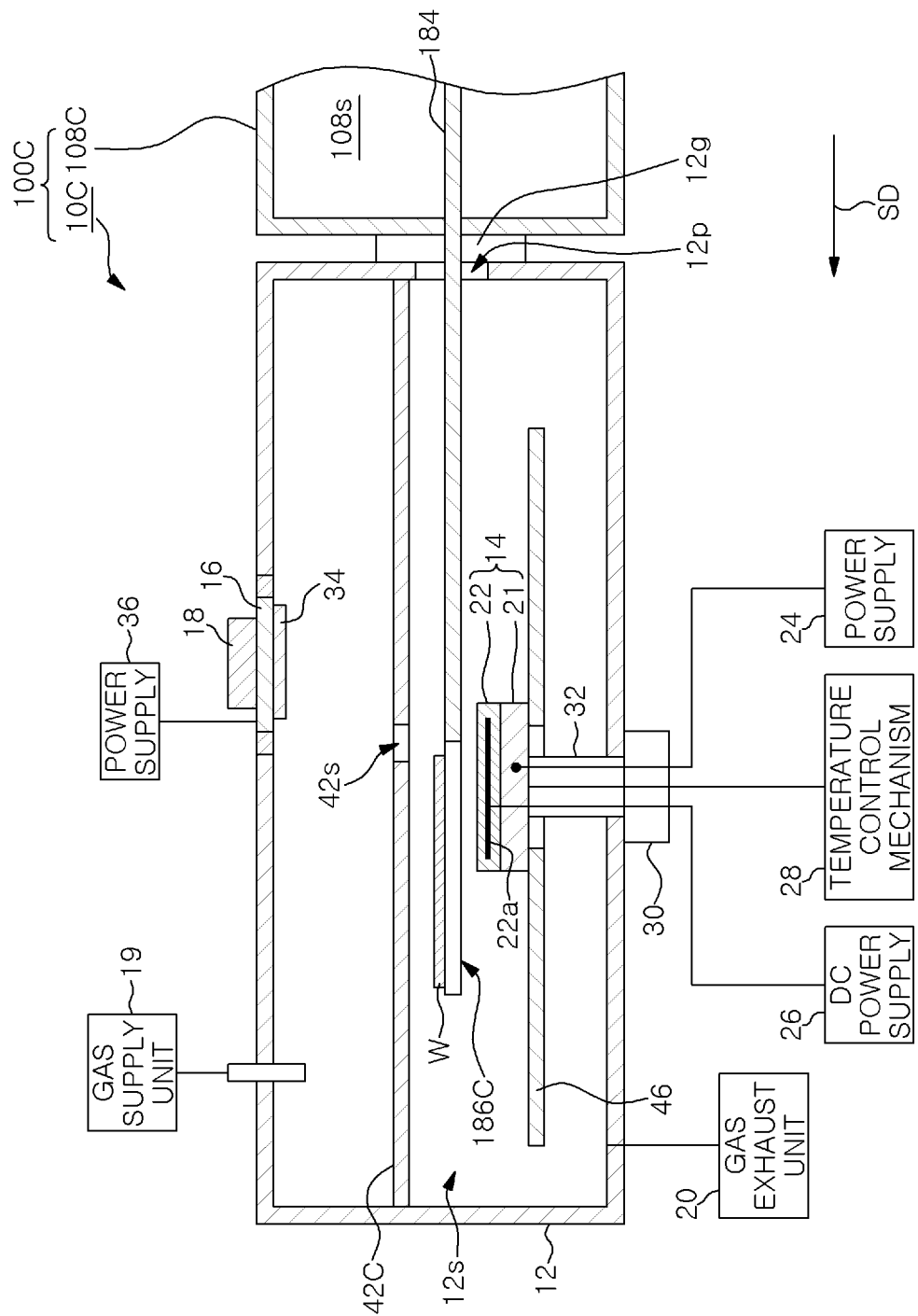
FIG. 17 schematically shows the film forming system according to still another embodiment.

Hereinafter, a film forming system according to still another embodiment will be described. FIGS. 15 to 17 schematically show a film forming system according to still another embodiment. In FIGS. 15 to 17, a structure in a vertical cross section of the film forming apparatus of the film forming system is illustrated together with a part of the transfer module. FIG. 16 shows a state in which the substrate W is moved from the position shown in FIG. 15 along the scanning direction SD. FIG. 17 shows a state in which the substrate W is further moved along the scanning direction SD from the position shown in FIG. 16.

In a film forming system 100C shown in FIGS. 15 to 17, the substrate W is moved along the scanning direction SD in the chamber during the film forming process in the film forming apparatus. Hereinafter, only the differences between the film forming system 100C and the film forming system 100 will be described. The film forming system 100C includes a film forming apparatus 10C instead of the film forming apparatus 10. The film forming system 100C includes a transfer module 108C instead of the transfer module 108. The other configurations of the film forming system 100C are the same as those of the film forming system 100.

In the film forming system 100C, a holder 16 and a cathode magnet 18 are provided obliquely above the stage 14, and the positions of the holder 16 and the cathode magnet 18 are fixed. Therefore, the position of the target 34 is also fixed at a position obliquely above the stage 14.

In the film forming system 100C, the shields 42 and 421 to 424 are not used. The film forming apparatus 10C of the film forming system 100C includes a shield 42C. The shield 42C has a substantially plate shape. The shield 42C extends in the horizontal direction between the holder 16 (or the target 34) and the stage 14.

The slit 42s that is the same as any one of the slits 42s of the shields 42 and 421 to 424 is formed in the shield 42C. The longitudinal direction of the slit 42s of the shield 42C is perpendicular to the scanning direction SD. The slit 42s of the shield 42C is provided on the path between the cathode magnet 18 and the stage 14 to expose the substrate W on the stage 14 to the target 34. In the film forming system 100C, the relative positional relation between the cathode magnet 18 and the slit 42s is fixed. Therefore, the incident angle of the particles which are released from the target 34, pass through the slit 42s and are incident on the substrate W below the shield 42C is a fixed incident angle determined by the above relative positional relation.

In the film forming system 100C, the substrate W is supported by the support portion of the transfer robot 182 of the transfer device 180. During the film forming process, in order to support particles from the target 34 to the entire surface of the substrate W, the substrate W is moved along the scanning direction SD by the transfer robot 182 between the shield 42 and the stage 14 in the processing space 12s. During the film forming process, the substrate W may be further moved along the direction opposite to the scanning direction SD by the transfer robot 182 between the shield 42 and the stage 14 in the processing space 12s.

The transfer robot 182 has a support portion 186C at a leading end of the arm 184. As described above, in the film forming system 100C, the substrate W is moved by the transfer robot 182, while the shield 42C and the cathode magnet 18 is fixed, during the film formation process. Therefore, the support portion 186C does not need to support the shield. Therefore, the support portion 186C may be configured to support only the substrate W. For example, the support portion 186C may have a C shape or a horseshoe shape along the bottom surface of the edge of the substrate W to support the substrate W.

In the film forming system 100C, the slit 42s of the shield 42C has the same shape as those of the slit 42s of the shield 421, the slit 42s of the shield 422, the slit 42s of the shield 423, or the slit 42s of the shield 424. When the slit 42s has the same shape as that of the slit 42s of the shield 421, the shield 42C has a surface 42p as in the case of the shield 421. The surface 42p extends in the direction toward the cathode magnet 18 from the edge of the shield 42C which defines the slit 42s. The edge extends along the slit 42s in parallel to the longitudinal direction of the slit 42s. The shield 42C may include a plate-shaped fin 42f having the surface 42p. The fin 42f has a plate shape. In the case of using the shield 42C, the range of the incident angle of the particles from the target 34 with respect to the substrate W is limited and, thus, the variation of the incident angle of the particles from the target 34 with respect to the substrate W is reduced.

Alternatively, when the slit 42s of the shield 42C has the same shape as that of the slit 42s of the shield 422, the shield 42C has a pair of surfaces 42p as in the case of the shield 422. The surfaces 42p extend in a direction toward the cathode magnet 18 from a pair of edges of the shield 42C which define the slit 42s. The edges of the shield 42C extend along the slit 42s in parallel to the longitudinal direction of the slit 42s. The shield 42C may include a pair of fins 42f that provide the pair of surfaces 42p. Each of the fins 42f has a plate shape. In the case of using the shield 42C, the range of the incident angle of the particles from the target 34 with respect to the substrate W is further limited and, thus, the variation in the incident angle of the particles from the target 34 with respect to the substrate W is further reduced.

Alternatively, when the slit 42s of the shield 42C has the same shape as that of the slit 42s of the shield 423, the shield 42C includes a plurality of partition walls 42d as well as the pair of fins 42f that provide the pair of surfaces 42p, as in the case of the shield 423. The partition walls 42d extend between the pair of surfaces 42p in a direction perpendicular to the longitudinal direction of the slit 42s, i.e., in a direction substantially parallel to the widthwise direction. The partition walls 42d are provided substantially in parallel to each other. In the case of using the shield 42C, the range of the incident angle of the particles from the target 34 to the substrate W is further limited and, thus, the variation in the incident angle of the particles from the target 34 with respect to the substrate W is further reduced.

Alternatively, when the slit 42s of the shield 42C has the same shape as that of the slit 42s of the shield 424, the variation of the thickness of the film formed on the substrate W in the direction perpendicular to the scanning direction SD (i.e., the longitudinal direction of the slit 42s) is further reduced.

When the transfer robot 182 has a plurality of support portions 186C same as the above-described support portions 186C at a leading end of the arm 184 and the shield 42C is provided with a plurality of slits 42s, a plurality of substrates supported by the support portions 186C may be scanned along the scanning direction SD. In other words, a plurality of substrates may be simultaneously subjected to the film forming process in the respective film forming apparatuses.

While various embodiments have been described above, various modifications can be made without being limited to the above-described embodiments. For example, each of the shields 42, 421 to 424 and 42C has one slit 42s. However, each of the shields 42, 421 to 424, and 42C may have two or more slits 42s. The two or more slits 42s are arranged along a direction (widthwise direction) perpendicular to the longitudinal direction of each slit 42s. When two or more slits 42s are formed in the shield, the film forming rate is increased.

Each of the film forming systems 100, 100B and 100C includes one transfer module 108. However, the film forming systems 100, 100B and 100C may include a plurality of transfer modules 108. In that case, another transfer module for transferring the substrate is interposed between each of the load-lock modules and each of the transfer modules 108. One or more processing modules that are the above-described film forming apparatuses are connected to the plurality of transfer modules 108. With this configuration, the film forming process can be performed by using a plurality of processing modules and, thus, the throughput can be improved.

While the present disclosure has been shown and described with respect to the embodiments, it will be understood by those skilled in the art that various changes and modifications may be made without departing from the scope of the present disclosure as defined in the following claims.

What is claimed is:

1. A method for forming a film on a substrate, the method comprising:
adjusting a relative positional relation between a slit of a shield that block particles released from a target in a processing space in a chamber of a film forming system and a cathode magnet provided outside the chamber by a first moving mechanism configured to move the shield between a stage in the processing space and the target along a scanning direction substantially parallel to a surface of the substrate mounted on the stage, and a second moving mechanism configured to move the cathode magnet along the scanning direction such that the particles released from the target are incident obliquely on the substrate at a desired incident angle;
moving the shield and the cathode magnet along the scanning direction by the first moving mechanism and the second moving mechanism while maintaining the relative positional relation between the slit and the cathode magnet such that the particles released from the target are incident obliquely on the substrate at the desired incident angle during the release of particles from the target in a state where the substrate is mounted on the stage;
moving the shield and the cathode magnet along a direction opposite to the scanning direction by the first moving mechanism and the second moving mechanism during the release of particles from the target; and
between said moving the shield and the cathode magnet along the scanning direction and said moving the shield and the cathode magnet along the direction opposite to the scanning direction, rotating the stage about a central axis of the stage to rotate the substrate about a center of the substrate by a predetermined angle,
wherein the slit has a rectangular shape and is formed in a longitudinal direction substantially perpendicular to the scanning direction, wherein a length of the slit in the longitudinal direction is greater than a width of the substrate in a direction parallel to the longitudinal direction, and a width of the slit in a widthwise direction is smaller than a width of the substrate in a direction parallel to the widthwise direction, wherein the shield includes a pair of plate-shaped fins, the pair of plate-shaped fins extending obliquely, with the desired incident angle at which the particles released from the target are incident on the substrate through the slit, toward the cathode magnet from a pair of edges that defines the slit, the pair of edges extending along the slit in parallel to the longitudinal direction, and the shield has a substantially plate shape in a plan view of the shield, and the slit has the rectangular shape in the plan view of the shield, the pair of plate-shaped fins being parallel to each other and extending obliquely with the desired incident angle from the shield in a side view of the shield.

2. The method of claim 1, wherein the film forming system further includes a transfer module having a transfer device configured to transfer the substrate between a transfer space in the transfer module and the processing space, and the first moving mechanism is the transfer device.

3. The method of claim 1, wherein the first moving mechanism moves the shield such that the longitudinal direction and the scanning direction are perpendicular to each other in the processing space.

\* \* \* \* \*